United States Patent [19]
Yoshikawa

[11] Patent Number: 6,064,697
[45] Date of Patent: May 16, 2000

[54] PULSE MODULATING METHOD, PULSE MODULATING EQUIPMENT AND PULSE DEMODULATING EQUIPMENT

[75] Inventor: Osamu Yoshikawa, Tokyo, Japan

[73] Assignee: SMK Corporation, Tokyo, Japan

[21] Appl. No.: 08/860,569

[22] PCT Filed: Oct. 21, 1996

[86] PCT No.: PCT/JP96/03040

§ 371 Date: Jun. 30, 1997

§ 102(e) Date: Jun. 30, 1997

[87] PCT Pub. No.: WO97/16889

PCT Pub. Date: May 9, 1997

[30] Foreign Application Priority Data

Oct. 30, 1995 [JP] Japan ................................ 7-303304

[51] Int. Cl.[7] .................................................. H04B 14/04
[52] U.S. Cl. .......................................... 375/242; 375/246
[58] Field of Search .................................... 375/242, 238, 375/239, 246; 341/50, 51, 52, 53; 329/313, 312; 332/112

[56] References Cited

U.S. PATENT DOCUMENTS

| | | | |
|---|---|---|---|
| 4,472,686 | 9/1984 | Nishimura et al. ................... 329/50 |
| 5,140,256 | 8/1992 | Hara ..................................... 324/77 R |
| 5,185,766 | 2/1993 | Cho ........................................... 375/87 |
| 5,315,299 | 5/1994 | Matsumoto ............................. 341/53 |
| 5,640,160 | 6/1997 | Miwa ..................................... 341/53 |

Primary Examiner—Stephen Chin
Assistant Examiner—Mohammad Ghayour
Attorney, Agent, or Firm—Armstrong, Westerman, Hattori, McLeland & Naughton

[57] ABSTRACT

The present invention provides a pulse modulating method which ensures demodulation of bit data without being affected by a change in the pulse width and permits high-speed transmission, pulse modulating equipment for the pulse modulating method and pulse demodulating equipment. The pulse modulating equipment divides an input signal into n-bit words and converts it into a pulse unit signal which represents the state of the bit data for each word by time intervals i and j between odd-numbered transitions and between even-numbered transitions. The respective time intervals i and j are free from the influence of the transmission line used, for example, and remains unchanged in the pulse demodulating equipment, so that no demodulation error arises. Further, since the bit data is represented by the time intervals i and j between the odd-numbered transitions and between the even-numbered transitions, the coding efficiency increases, permitting high-speed transmission.

4 Claims, 11 Drawing Sheets

| 4-BIT DATA | TRANSMISSION CODE | | | | PULSE UNIT WAVEFORM | PULSE CODE |
|---|---|---|---|---|---|---|
| | i1 | j1 | i2 | j2 | | |
| 0000 | 5T | 5T | – | – | | 100001 |
| 0001 | 4T | 5T | – | – | | 100011 |
| 0010 | 3T | 3T | 2T | 2T | | 100101 |
| 0011 | 3T | 5T | – | – | | 100111 |
| 0100 | 2T | 2T | 3T | 3T | | 101001 |
| 0101 | 2T | 2T | 2T | 3T | | 101011 |
| 0110 | 2T | 3T | 3T | 2T | | 101101 |
| 0111 | 2T | 5T | – | – | | 101111 |
| 1000 | 5T | 4T | – | – | | 110001 |
| 1001 | 4T | 4T | – | – | | 110011 |
| 1010 | 3T | 2T | 2T | 2T | | 110101 |
| 1011 | 3T | 4T | – | – | | 110111 |
| 1100 | 5T | 3T | – | – | | 111001 |
| 1101 | 4T | 3T | – | – | | 111011 |
| 1110 | 5T | 2T | – | – | | 111101 |
| 1111 | – | – | – | – | | 111111 |

FIG.1

| 2-BIT DATA | TRANSMISSION CODE | | PULSE UNIT SIGNAL WAVEFORM | PULSE CODE |
|---|---|---|---|---|
| | $i_1$ | $j_1$ | | |
| 00 | 2T | 2T | ←2T→ ↕ ←2T→ | 101 (010) |
| 01 | 2T | 3T | ←2T→ ↕ ←3T→ | 1011 (0100) |
| 10 | 3T | 2T | ←3T→ ↕ r1 r2 r3 r4 ←2T→ | 1101 (0010) |
| 11 | 3T | 3T | ←3T→ ↕ ←3T→ | 1001 (0110) |

FIG.2

| a | r1 i1 r3 | | |
|---|---|---|---|
| b1 | r1 r2 r3 ←T→    $j_1 \geq i_1$ | b2 | r1 r3 r4 ←T→    $j_1 < i_1$ |
| c1 | ←i1→ r1 r2 r3 r4 ←j1→ | c2 | ←i1→ r1 r2 r3 r4 ←j1→ |

FIG.8
| 4-BIT DATA | TRANSMISSION CODE | | PULSE UNIT WAVEFORM | PULSE CODE |
|---|---|---|---|---|
| | i1 | j1 | | |
| 0000 | 2T | 2T |  | 110011 |
| 0001 | 2.5T | 2T |  | 1110011 |
| 0010 | 3T | 2T |  | 11110011 |
| 0011 | 3.5T | 2T |  | 111110011 |
| 0100 | 2T | 2.5T | 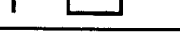 | 1100111 |
| 0101 | 2.5T | 2.5T | 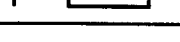 | 1100011 |
| 0110 | 3T | 2.5T | 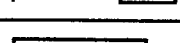 | 11110011 |
| 0111 | 3.5T | 2.5T |  | 111110011 |
| 1000 | 2T | 3T | 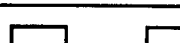 | 11001111 |
| 1001 | 2.5T | 3T |  | 11000111 |
| 1010 | 3T | 3T |  | 11000011 |
| 1011 | 3.5T | 3T |  | 111000011 |
| 1100 | 2T | 3.5T |  | 110011111 |
| 1101 | 2.5T | 3.5T |  | 110001111 |
| 1110 | 3T | 3.5T |  | 110000111 |
| 1111 | 3.5T | 3.5T |  | 110000011 |

FIG.9
| 4-BIT DATA | TRANSMISSION CODE | | | | PULSE UNIT WAVEFORM | PULSE CODE |
|---|---|---|---|---|---|---|
| | i1 | j1 | i2 | j2 | | |
| 0000 | 5T | 5T | – | – |  | 100001 |
| 0001 | 4T | 5T | – | – |  | 100011 |
| 0010 | 3T | 3T | 2T | 2T |  | 100101 |
| 0011 | 3T | 5T | – | – | 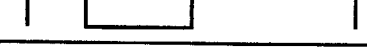 | 100111 |
| 0100 | 2T | 2T | 3T | 3T | 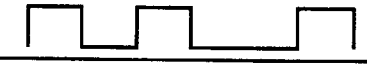 | 101001 |
| 0101 | 2T | 2T | 2T | 3T | 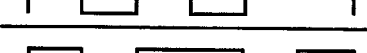 | 101011 |
| 0110 | 2T | 3T | 3T | 2T | 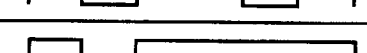 | 101101 |
| 0111 | 2T | 5T | – | – |  | 101111 |
| 1000 | 5T | 4T | – | – |  | 110001 |
| 1001 | 4T | 4T | – | – |  | 110011 |
| 1010 | 3T | 2T | 2T | 2T |  | 110101 |
| 1011 | 3T | 4T | – | – |  | 110111 |
| 1100 | 5T | 3T | – | – |  | 111001 |
| 1101 | 4T | 3T | – | – |  | 111011 |
| 1110 | 5T | 2T | – | – |  | 111101 |
| 1111 | – | – | – | – |  | 111111 |

PULSE MODULATING METHOD, PULSE MODULATING EQUIPMENT AND PULSE DEMODULATING EQUIPMENT

FIELD OF THE INVENTION

The present invention relates to a method of and equipment for modulating an input signal composed of data bits into a pulse signal, and pulse demodulating equipment.

DESCRIPTION OF THE RELATED ART

There have heretofore been known, as pulse modulating methods of this kind, pulse amplitude modulation (PAM), pulse width modulation (PWM) and pulse position modulation (PPM) methods which change the pulse amplitude, pulse width and pulse position of the pulse wave used as a carrier, respectively, in accordance with the data bits.

In optical communication systems which use infrared rays and similar rays of light as carriers, the pulse amplitude modulation (PAM) which represents data bits by light intensity, in particular, has a problem with its reliability; therefore, the pulse width modulation (PWM) or pulse position modulation (PPM) has been used in combination with other modulation methods.

FIGS. 13(a) and (b) show signal waveforms by an ASK (Amplitude-Shift-Keying) system which is an example of such a combined use of different modulation methods. Digital data composed of a plurality of data bits is converted into a pulse signal (a) by an NRZ (Non-Return-to-Zero) data modulation scheme which makes the digital data "L" (low) or "H" (high), depending on whether the data bits is "0" or "1" and the pulse signal (a) is used as a modulating wave for ASK modulation of a burst signal into a modulated wave (b).

In the case of demodulating the modulated wave (b), the envelope waveform of the burst signal is extracted from the input signal and is waveform-shaped into the pulse signal (a), from which the plurality of data bits is demodulated by marking and spacing portions of the phase signal a "1" and a "0", respectively.

The ASK system represents 1-bit data by a pulse signal of a waveform of the same duration as that of the data, and hence it permits transmission of data in large quantities and is suitable for high-speed data transmission.

However, since the pulse width of the pulse signal (a) modulated by the NRZ data modulation varies under the influence of frequency characteristics of the light emitting element, the light receiving element and the modem circuit and the transmission line used, the pulse width of the demodulated pulse signal does not always become the same as the pulse width of the modulated signal.

For example, the received waveform at the demodulating side may sometimes expand its pulse width, because of a delay in the fall of the pulse waveform as indicated by a received waveform 1 in FIG. 14, or narrow its pulse width, because of a delay in either of the rise and fall of the pulse waveform as indicated by a received waveform 2 in FIG. 14. That is, the pulse width $C_0$ of the transmitted waveform does not necessarily become the same as the pulse width $C_1$ or $C_2$ of the received waveforms 1 or 2.

In the demodulation of data bits from the pulse signal of such a varied pulse width, a shift in its pulse position causes a demodulation error.

On the other hand, there has also been known a PPM system which changes the time interval $A_0$ between leading edges of the modulated pulse signal according to the data bits, through utilization of the fact that the time width $A_0$ between leading edges of the pulse signal is equal to the time intervals $A_1$ and $A_2$ between the leading edges of the demodulated signals. As shown in FIG. 13(c), according to the PPM system, each data bit of the digital data is preceded by a pulse of a width T and the subsequent pulse quiescent period is represented by a time interval T or 3T, depending on whether the data bit is "0" or "1" and the thus converted pulse signal (c) is used as a modulating wave for the ASK modulation of the burst signal.

With the PPM system, demodulation errors decrease, but since each 1-bit data is represented by the pulse quiescent period, the frame transmission period for sending a plurality of data bits in its entirety is long, giving rise to the problem of low transmission rate.

As a solution to this problem, there has been developed such Serial Infrared (hereinafter "SIR") modulation system as shown in FIG. 13(d), which represents a plurality of data bits based on the position of respective leading edges of a pulse signal (d) so as to exclude the influence of pulse width variations and raise the transmission rate. According to the SIR system, a plurality of data bits is divided into words, each composed of 2-bit data, and the leading edge or phase of a pulse of the width T is changed within a time interval 4T of the 2-bit data in accordance with its four kinds of states.

Even with this pulse modulation method, however, since the data bit is represented by the pulse leading edge alone, the level of redundancy is so high that there is a limit to an increase in the transmission rate.

SUMMARY OF THE INVENTION

The present invention is intended to solve the problems mentioned above and, based on the fact that, while in FIG. 14, the pulse width $C_0$ in the received waveform differs from the width in the transmitted waveform, the time intervals $A_0$ and $B_0$ between the pulse leading edges and between the trailing edges remain substantially unchanged, the invention offers a pulse modulation method which represents data bits by the two kinds of time intervals $A_0$, $13_0$, increases the coding efficiency and permits demodulation free from the influence of the transmission system used.

That is, it is an object of the present invention to provide a pulse modulating method which ensures demodulation of data bits even if the pulse width varies, pulse modulating equipment therefor and pulse demodulating equipment.

Another object of the present invention is to provide a pulse modulating method which permits high-speed transmission of data bits, pulse modulating equipment therefor and pulse demodulating equipment.

Another object of the present invention is to provide a pulse modulating method which is low in the level of redundancy and hence, is high in coding efficiency and permits high-speed transmission.

Another object of the present invention is to provide a pulse modulating method which permits reduction of the frame transmission period for the transmission of data bits in its entirety.

Still another object of the present invention is to provide a pulse modulating method which allows ease in detecting an error during, modulation and easy demodulation and, even if a transit signal is applied by noise or the like during demodulation of the current word, prevents it from affecting the demodulation of other words.

In a pulse modulating method according to one aspect of the present invention which converts an input signal composed of plural bit data into a modulated pulse signal: the input signal is divided into words each composed of n-bit data (n being a positive integer equal to or greater than 2), time intervals $i_m$ and $j_m$ (m being a positive integer starting with 1) are combined to form at least $2^n$ or more transmission codes; all states of the n-bit data are made to correspond to the transmission codes, respectively; in accordance with the transmission code corresponding to the state of the data bits for each word, the input signal is converted into pulse unit signals which have the time interval i between (2m−1)th and (2m+1)th transitions and the time interval $j_m$ between (2m)th and (2m+−2)th transitions; and the pulse unit signals thus converted in word units are concatenated into a modulated pulse signal.

With this method, either one of the time intervals $i_m$ and $j_m$ between transitions of the pulse unit signal converted for each word represents the time interval between respective leading edges of the pulse unit signal and the other one represents the time interval between its respective trailing edges. The pulse width of the pulse unit signal varies under the influence of frequency characteristics of the light emitting element, the light receiving element and the modem circuit. But since each rise or fall of the pulse unit signal is affected under the same condition, the pulse signal that represents respective states of the bit data by the time intervals between the leading edges and between the trailing edges can be demodulated without being affected by the above-mentioned frequency characteristics.

Moreover, since the state of the n-bit data is represented by both of the time intervals between the leading edges and between the trailing edges of the pulse unit signal, redundancy is eliminated and the coding efficiency is increased, permitting high-speed transmission of data bits.

In a pulse modulating method according to another aspect of the present invention, the first transition of each pulse unit signal is the last transition of the immediately preceding pulse unit signal.

With this method, the first transition of the pulse unit signal of each word may be a rise or fall of the pulse. That is, the current pulse unit signal can be concatenated with the immediately preceding pulse unit signal, using the last transition of the latter as the first transition of the former, whether it is a rise or fall of the pulse. Since the last transition of the immediately preceding pulse unit signal can be used to concatenate therewith the current pulse unit signal, the frame transmission period for transmitting the entire data bit stream can be shortened.

In a pulse modulating method according to another aspect of the present invention, the input signal is divided in units of words each composed of 2-bit data, time intervals $i_1$ and $j_1$ are selected from 2T and 3T, T being a unit time interval, the time intervals $i_1$ and $j_1$ are combined into four different transmission codes, and the input signal is converted into pulse unit signals, each having the time intervals $i_1$ and $j_1$ between first and third transitions and between second and fourth transitions, respectively.

With this method, the four states of the 2-bit data can be made to correspond to the four transmission codes which are combinations of the time intervals 2T and 3T. The time intervals $i_1$ and $j_1$, between the first and third transitions of the pulse unit signal and between its second and fourth transitions, are either 2T or 3T, and letting the pulse width be represented by T, the duration of the pulse unit signal is 3T or 4T. Thus, the period for transmitting all of the data bits can be reduced.

In a pulse modulating method according to another aspect of the present invention, the input signal is divided in units of words each composed of 4-bit data, time intervals $i_1$ and $j_1$ are selected from 2T, 2.5T, 3T and 3.5T, T being a unit time interval, the time intervals $i_1$ and $j_1$ are combined into 16 different transmission codes, and the input signal is converted into pulse unit signals, each having the time intervals $i_1$ and $j_1$ between its first and third transitions and between its second and fourth transitions, respectively.

With this method, 16 kinds of states of the 4-bit data can be made to correspond to the 16 kinds of transmission codes which are combinations of 2T, 2.5T, 3T and 3.5T. The time intervals $i_1$ and $j_1$ between the first and third transitions of the pulse unit signal and between its second and fourth transitions are any one of 2T, 2.5T, 3T and 3.5T, and letting the pulse width be represented by T, the duration of each pulse unit signal is in the range of 3T to 4.5T. Thus, the period for transmitting all of the data bits can be reduced.

According, to another aspect of the present invention, the unit time interval T is the data width of 1-bit data.

According to another aspect of the present invention, the time interval F between first and last transitions of each pulse unit signal is constant.

With this method, since the duration F of each pulse unit signal is constant, the period for transmitting all of the data bits is also constant, allowing ease in detecting a demodulation error. Further, since the modulated signal can be demodulated into data bits of each word at the time intervals F, the demodulation is easy and, even if a transit signal is applied by noise or similar, it does not affect the demodulation of other words.

In a pulse modulating method according to another aspect of the present invention, $2^n$ kinds of NRZ data signals are assumed which were NRZ data modulated by (n+2) data bits whose most and least significant bits are "1s" in common to them but whose intermediate bits differ from one another, and time intervals between (2m−1)th and (2m+1)th transitions and between its (2m)th and (2m+2)th transitions of each NRZ data signal are combinations of the time intervals $i_m$ and $j_m$ and the time interval F is used as the duration of the NRZ data signals which were NRZ data modulated by (n+2) data bits.

With this method, the $2^n$ kinds of NRZ data signals are pulse signals that correspond to all different data of the intermediate n-bit data. The NRZ data signals have the time interval between transitions at their opposite ends defined by the time interval of the (n+2) bit data but differ in the intermediate pulse waveform and in the combination of time intervals between their odd-numbered transitions and between their even-numbered transitions. Hence, by defining the combinations of these time intervals by the combinations of the time intervals $i_m$ and $j_m$, it is possible to obtain $2_n$ kinds of transmission codes which provide pulse unit signals of the fixed duration F.

Pulse modulating equipment according to another aspect of the present invention comprises: a serial-parallel converter which divides a serial input signal composed of a plurality of data bits in steps of n bits (n being a positive integer equal to or greater than 2) and outputs the input signal as n-bit parallel data; an encoded table storage circuit which obtains at least $2^n$ kinds of different transmission codes by combining time intervals $i_m$ and $j_m$ (m being a positive integer beginning with 1) and wherein pulse codes which have time intervals between (2m−1)th and (2m+1)th transitions and between (2m)th and (2m+2)th transitions of pulse unit signals defined by $i_m$ and $j_m$, respectively, in accordance with the transmission codes are stored in correspondence with respective states of n-bit parallel data; an encoder circuit which reads out the pulse code corresponding to the n-bit parallel data from the encoded table storage circuit and outputs it; a pulse signal generator which generates pulse unit signals from the pulse codes and outputs them serially; and a pulse output circuit which concatenates the pulse unit signals converted every n-bit parallel data into a pulse signal and outputs it.

With this construction, a plurality of data bits are divided by the serial-parallel converter into n-bit parallel data. The encoder circuit supplies the pulse signal generator with pulse codes corresponding to the states of n-bit parallel data. Based on the pulse codes, the pulse signal generator serially outputs pulse unit signals which have the time intervals between odd-numbered transitions and between even-numbered transitions defined as $i_m$ and $j_m$, respectively. The pulse output circuit outputs the pulse signal into which the pulse unit signals are concatenated.

Hence, the bit data of the n-bit parallel data is represented by the time intervals between trailing edges of the pulse unit signal and between its leading edges, and even if the pulse width changes under the influence of the state of transmission, it is possible to output a pulse signal free from a demodulation error.

Pulse demodulating equipment according to another aspect of the present invention comprises: a transition detecting circuit which divides an input pulse signal every fixed number K of transitions and, for each pulse unit signal defined by the K transitions, repeatedly detects the time intervals $i_m$ and $j_m$ between the (2m−1)th (m being a positive integer beginning with 1) and (2m+1)th transitions and between the (2m)th and (2m+2)th transitions; a decoded table storage circuit wherein at least $2^n$ (n being a positive integer equal to or greater than 2) different combinations of time intervals $i_m$ and $j_m$ (m being a positive integer in the range of 1 to K) are stored in correspondence with respective states of the n-bit data; a decoder circuit which reads out the n-bit data from the decoded table storage circuit corresponding to the combination of the time intervals $i_m$ and $j_m$ detected by the transition detecting circuit and outputs it as n-bit parallel data; and a parallel-serial converter which converts each n-bit parallel data demodulated for each pulse unit signal into a serial signal and outputs it as a signal composed of a plurality of data bits.

With this construction, the input pulse signal is divided every fixed number K of transitions. By setting the number K to be equal to the number of inversions of the pulse unit signal converted from the n-bit data, the input pulse signal is divided into pulse unit signals. The transition detecting circuit detects, for each pulse unit signal, the time intervals $i_m$ and $j_m$ between its odd-numbered transitions and between its even-numbered transitions. The decoder circuit reads out the n-bit data from the decoded table storage circuit corresponding to the combination of the time intervals $i_m$ and $j_m$ and outputs it as n-bit parallel data. The n-bit parallel data are converted by the parallel-serial converter into a serial signal of n-bit data, which is concatenated with a serial signal of n-bit data similarly demodulated from the immediately preceding pulse unit signal, obtaining an output signal composed of plural data bits.

Hence, data bits can be demodulated from the pulse signal representing the pulse data bits by the time intervals between the trailing edges and between leading edges, and even if the pulse width changes under the influence of the state of transmission, no demodulation error will arise.

Moreover, even if the pulse unit signals converted from the n-bit data have different durations, it is possible to divide the input pulse signal into pulse unit signals by adjusting the number K of transitions and demodulate the pulse signal for each pulse unit signal.

Pulse demodulating equipment according to another aspect of the present invention comprises: a transition detecting circuit which divides an input pulse signal at fixed time intervals F and, for each pulse unit signal defined by the duration F, detects time intervals $i_m$ and $j_m$ between (2m−1)th (m being a positive integer beginning with 1) and (2m+1)th transitions and between (2m)th and (2m+2)th transitions; a decoded table storage circuit wherein at least $2^n$ (n being a positive integer equal to or greater than 2) different combinations of time intervals $i_m$ and $j_m$ (m being a positive integer in the range of 1 to K) are stored in correspondence with respective states of the n-bit data; a decoder circuit which reads out the n-bit data from the decoded table storage circuit corresponding to the combination of the time intervals $i_m$ and $j_m$ detected by the transition detecting circuit and outputs it as n-bit parallel data; and a parallel-serial converter which converts each n-bit parallel data demodulated for each pulse unit signal into a serial signal and outputs it as a signal composed of a plurality of data bits.

With this construction, the input pulse signal is divided at fixed time intervals F. By setting the duration F to be equal to the duration of each pulse unit signal converted from the n-bit data, the input pulse signal is divided in pulse unit signals. The transition detecting circuit detects, for each pulse unit signal, the time intervals $i_m$ and $j_m$ between its odd-numbered transitions and between its even-numbered transitions. The decoder circuit reads out the n-bit data from the decoded table storage circuit corresponding to the combination of the time intervals $i_m$ and $j_m$ and outputs it as n-bit parallel data. The n-bit parallel data are converted by the parallel-serial converter into a serial signal of n-bit data, which is concatenated with a serial signal of n-bit data similarly demodulated from the immediately preceding pulse unit signal, obtaining an output signal composed of plural data bits.

Hence, data bits can be demodulated from the pulse signal representing the plural data bits by the time intervals between the trailing edges and between leading edges, and even if the pulse width changes under the influence of the state of transmission, no demodulation error will arise.

BRIEF DESCRIPTION OF THE DRAWINGS

FIG. 1 is an explanatory diagram showing four kinds of states of 2-bit data and the relationships thereto of transmission codes and pulse codes in a 2-bit variable length system according to a first embodiment of the present invention;

FIG. 2 is an explanatory diagram showing the procedure for generating pulse unit signals in accordance with following the transmission codes;

FIG. 8 is an explanatory diagram showing 16 kinds of states of 4-bit data and the relationships thereto of transmission codes and pulse codes in a 4-bit variable length system according to a second embodiment of the present invention;

FIG. 9 is an explanatory diagram showing 16 kinds of states of 4-bit data and the relationships thereto of transmission codes and pulse codes in a 4-bit fixed length system according to a third embodiment of the present invention;

DETAILED DESCRIPTION OF THE PREFERRED EMBODIMENTS

Figure 3:
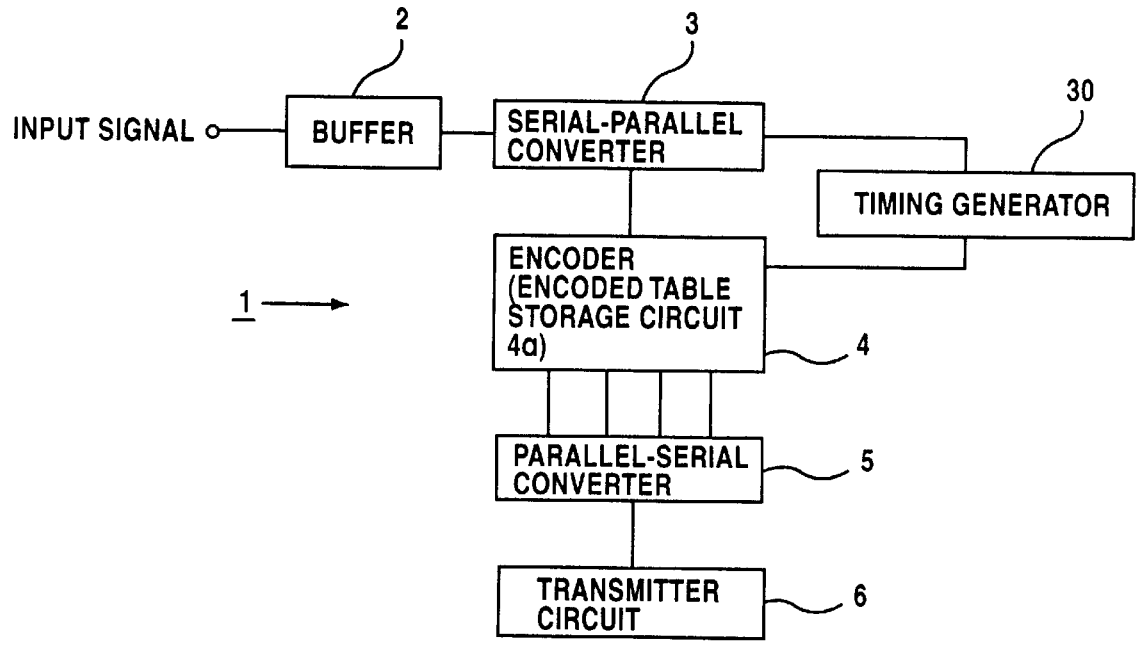
FIG. 3 is a block diagram illustrating the configuration of pulse modulating equipment 1 for use in the 2-bit variable length system according to the present invention.

A description will be given, with reference to FIGS. 1 through 6, of a pulse modulating method according to a first embodiment of the present invention.

FIG. 1 shows four kinds of states of two-bit data and the relationships between the four kinds of states and transmission and pulse codes corresponding thereto.

In this embodiment, an input signal composed of plural data bits is divided into words of two-bit data and pulse modulation is carried out for each two-bit data to obtain a pulse unit signal.

As depicted in FIG. 1, each two-bit data assumes one of four different states and transmission codes $(i_2, j_1)$, which are four kinds of combinations of time intervals 2T and 3T, are each assigned to one of the four states.

The transmission code $i_1$ represents the time interval between first and third transitions and $j_1$ the time interval between second and fourth transitions. Reference character T denotes a unit time interval, which is equal to the minimum pulse width and the minimum pulse quiescent time of the pulse unit signal.

Accordingly, when the two-bit data of one word is, for example, "1, 0," the time intervals, between the first and third transitions $r_1$ and $r_3$ and between the second and fourth transitions $r_2$ and $r_4$, are 3T and 2T, respectively, and the minimum pulse width and the minimum pulse quiescent time are T as shown in FIG. 1. Thus, the pulse code which forms the pulse unit signal is "1101."

Referring now to FIG. 2, the procedure for forming the pulse unit signal based on the transmission codes will be described.

In the first place, the time interval between the first and third transitions $r_1$ and $r_3$ is determined based on the transmission code $i_1$ (a).

Next, the transmission codes $i_1$ and $j_1$ are compared and when $j_1 \geq i_m$, a point in time which is the unit time T behind the first transition $r_1$ is set as the point of second transition $r_2$.

Then, a point in time, which is behind the second transition $r_2$ by the time corresponding to the transmission code $j_1$, is set as the point of fourth transition $r_4$. Thus, a pulse unit signal is obtained which transits its level at these four points in time (c1).

On the other hand, when $j_1 \leq i_1$, a point in time, which is the unit time T behind the third transition $r_3$, is set as the point of fourth transition $r_4$ (b2).

Following this, a point in time which is ahead of the fourth transition $r_4$ by the time corresponding to the transmission code $j_1$ is set as the point of second transition $r_2$. Thus, a pulse unit signal is obtained which transits its level at these four points in time (c2).

In this way, the two-bit data forming each word is converted into one of four kinds of pulse unit signals each composed of three or four bits. (The pulse modulating method according to this embodiment will hereinafter be referred to as a two-bit variable length system.)

Incidentally, the pulse unit signals thus converted in word units are concatenated into a sequence of pulse signals. In this instance, the pulse unit signals are concatenated using the last transition (the fourth transition $r_4$ in this embodiment) of the immediately preceding pulse unit signal as the first transition $r_1$ of the immediately following pulse unit signal. Hence, the pulse unit signals of odd-numbered words rise at the points of first transitions $r_1$ as shown in FIGS. 1 and 2, whereas the pulse unit signals of even-numbered words concatenated with them fall at the points of first transitions $r_1$, and consequently, their pulse waveforms are opposite in level to those shown in FIGS. 1 and 2 and their pulse codes are also opposite to those shown therein.

Figure 5:
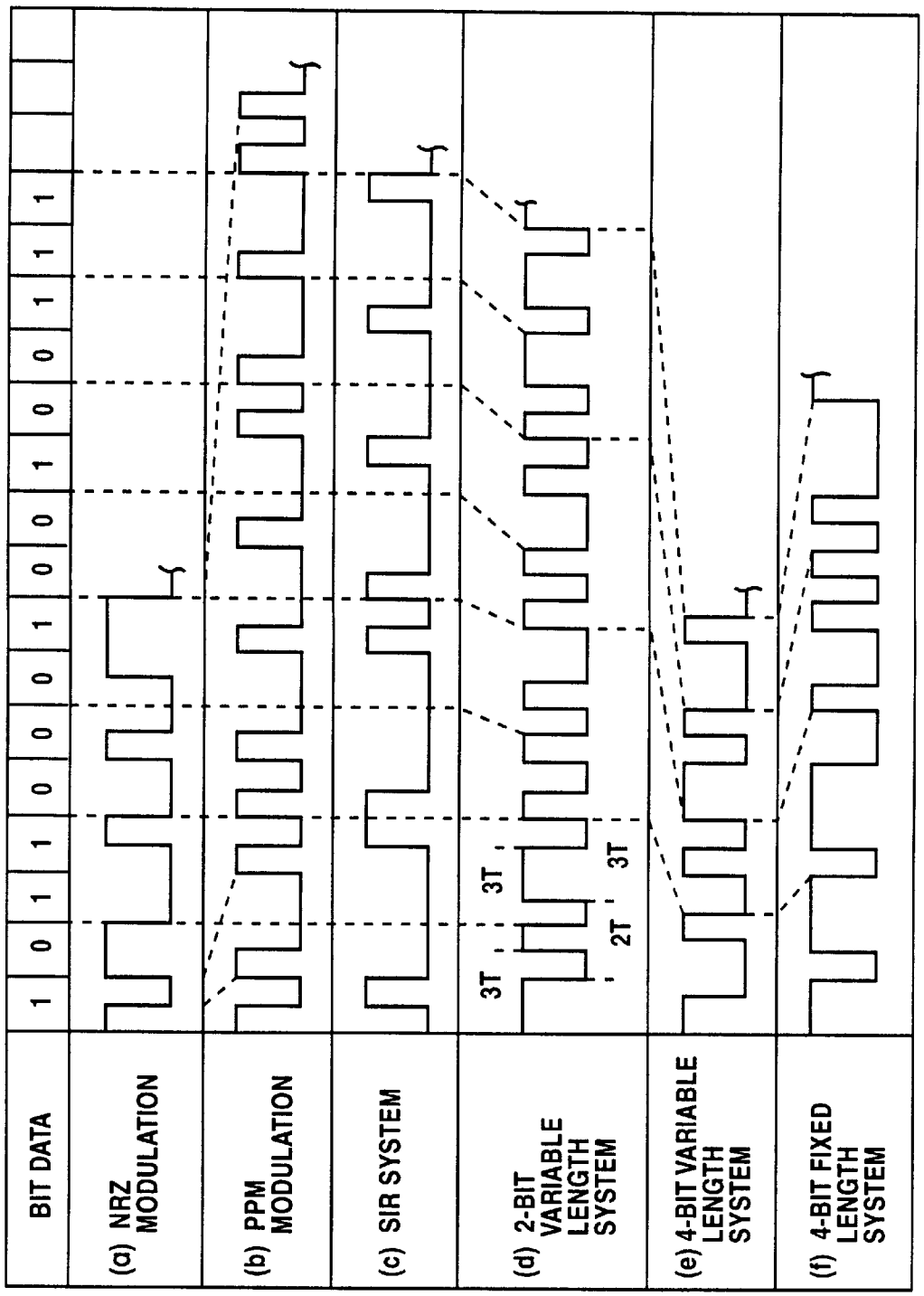
FIG. 5 is a waveform diagram showing, in comparison, a pulse signal converted by a conventional pulse modulating method and a pulse signal converted by the pulse modulating method according to th resent invention, with the minimum width T of each pulse signal set at ½ the data width of the input signal.
Figure 6:
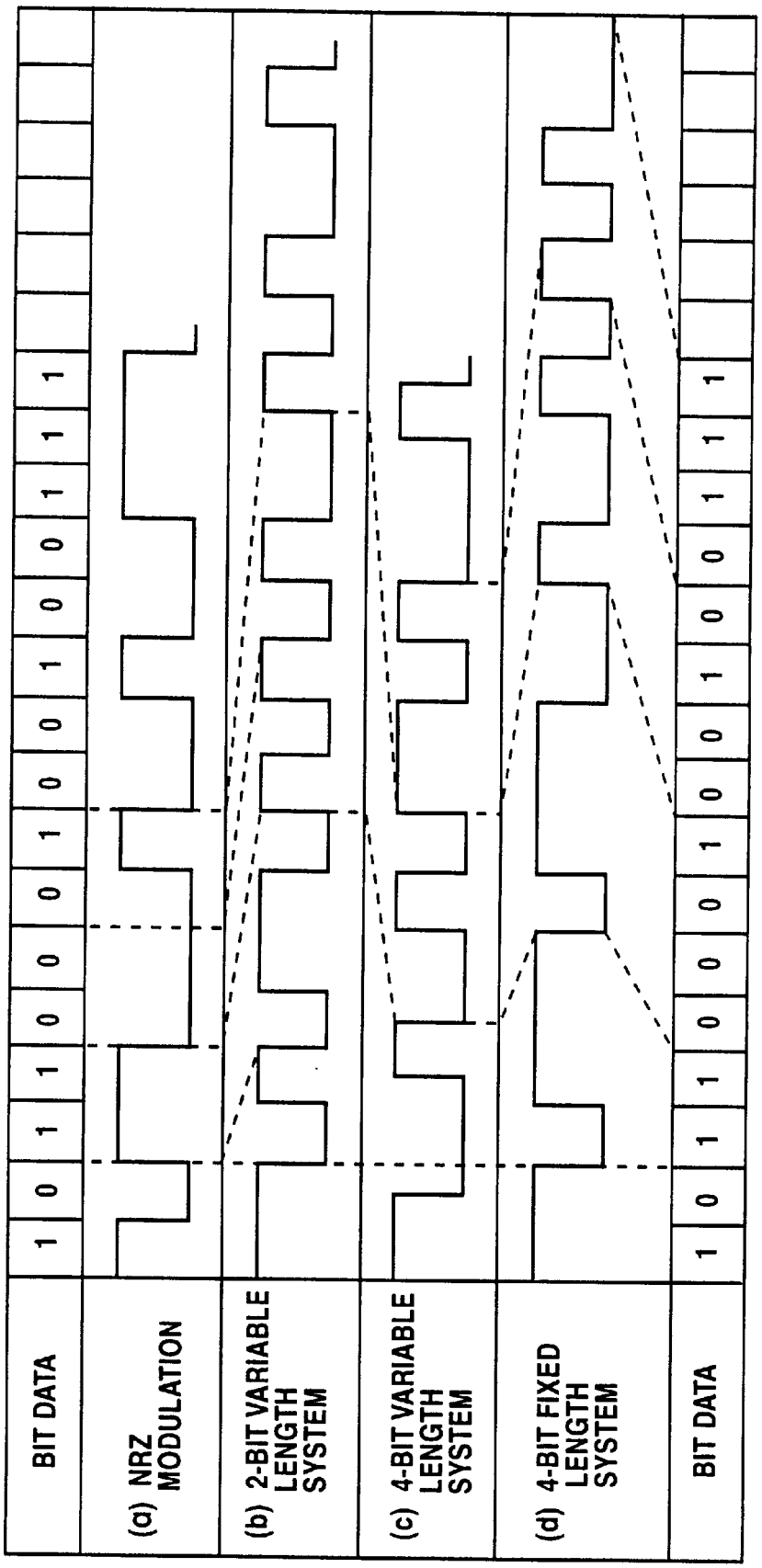
FIG. 6 is a waveform diagram showing, in comparison, a pulse signal converted by a conventional pulse modulating method and a pulse signal converted by the pulse modulating method according to the present invention, with the minimum width T of each pulse signal set to be equal to the data width of the input signal.

FIGS. 5(d) and 6(b) show the waveforms of pulse signals converted using the two-bit variable length system according to the present invention, FIG. 5 shows the waveform. with the unit time T (the minimum pulse width of the pulse signal) set at half the data width of the input signal and FIG. 6 shows the waveform with the unit time T set at a value equal to the data width of the input signal.

Assuming that the input signal is 16-bit data such as shown in FIGS. 5 and 6, the pulse signal converted by the two-bit variable length system is 30-bit pulse signal, and as is evident from FIG. 5, its transmission period is about twice as long as in the case of the NRZ data modulation (a) but about half that in the case of the PPM modulation (b) and a little shorter than in the case of the SIR system.

FIG. 3 is a block diagram illustrating the configuration of pulse modulating equipment 1 according to the present invention, which will be described as being applied to the conversion of the input signal into a pulse signal by the above-described two-bit variable length system.

In FIG. 3, a serial input signal composed of plural data bits is input into a serial-parallel converter 3 via a buffer 2. The buffer 2 temporarily stores the serial input signal and outputs it as the serial-parallel conversion proceeds in the serial-parallel converter 3. The serial-parallel converter 3 converts the serial input signal from the buffer 3 into parallel data in word units of two-bit data for input into an encoder 4.

The encoder 4 is provided with an encoded table storage circuit 4a wherein the respective states of two-bit data and the pulse codes, such as shown in FIG. 1, are stored in correspondence with each other. As described previously, the pulse codes, based on the transmission codes $i_1$ and $j_1$ corresponding to the two-bit data, each form a pulse unit signal which has the time interval $i_1$ between odd-numbered transitions and the time interval $j_1$ between even-numbered transit positions.

The encoder 4 reads out the pulse codes corresponding to the two-bit parallel data inputted thereto from the encoded table storage, circuit 4a and provides them to a parallel-serial converter 5 that serves as a pulse signal generator. For example, if the two-bit parallel data is "0, 1," a pulse code of four bits "1011" is output.

In this instance, if the least significant bit LSB of the immediately preceding pulse code is "1," the above pulse code is inverted to "0100." The reason for this is that since the least significant bit LSB of the pulse code of the odd-numbered word is a "1" to form the last transition $r_4$ of the pulse unit signal as a falling edge, the pulse code of the immediately subsequent even-numbered word is inverted and the falling edge of the preceding pulse unit signal is used as the first transition of the pulse unit signal immediately subsequent thereto.

Reference numeral 30 denotes a timing generator connected between the output of the encoder 4 and the input of the serial-parallel converter 3, for controlling the output from the serial-parallel converter 3 in accordance with the pulse code output state of the encoder 4. That is, the pulse codes that are output from the encoder 4 are codes of different lengths of three and four bits and when the four-bit pulse code is output, the output timing of the serial-parallel converter 3 is delayed by one bit.

Based on the pulse codes, the parallel-serial converter 5 generates pulse unit signals and serially applies them to a transmitter circuit 6. The transmitter circuit 6 is provided with a pulse output circuit, by which the pulse unit signals output in word units are concatenated into a serial converted pulse signal. The transmitter circuit 6 is further provided with an infrared-emitting circuit which emits infrared rays according to the pulse signal; the infrared rays containing the serial converted pulse signal are emitted to pulse demodulating equipment 7.

Figure 4:
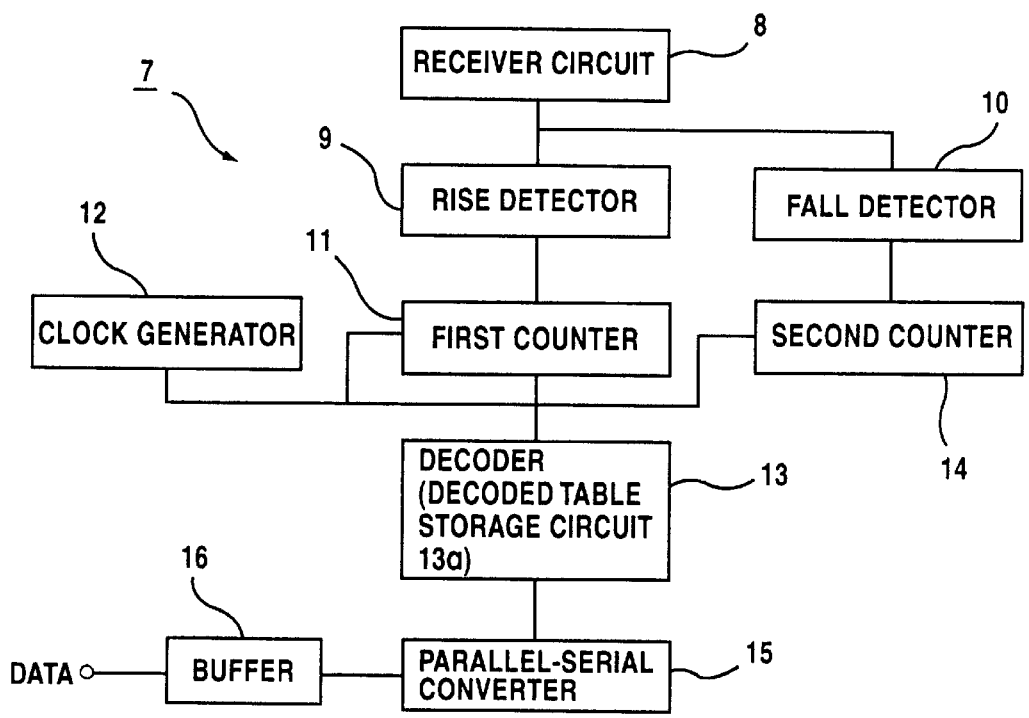
FIG. 4 is a block diagram illustrating pulse demodulating equipment for demodulating plural data bits from a pulse signal converted by the 2-bit variable length system according to the present invention.

FIG. 4 is a block diagram of the pulse demodulating equipment 7 which receives the infrared rays containing the pulse signal and demodulates it into a plurality of data bits.

When received by a receiver circuit 8, the infrared containing the pulse signal are subjected to photoelectric conversion and then waveform-shaped into a pulse signal. The output of the receiver circuit 8 is connected to a rise detector 9 and a fall detector 10 for detecting the rise and fall of the pulse signal which is output from the receiver circuit 8.

Upon detection of the rise of the pulse signal, the rise detector 9 applies the rise detection signal to a first counter 11 connected to the output thereof.

The first counter 11 always counts clock signals from a clock generator 12 and, when supplied with the rise detection signal, provides the current count value as a first count value UC to a decoder 13, while at the same time it resets its count value to zero and resumes counting the clock signals. That is, the first count value UC from the first counter 11 represents the time interval between two successive rising or leading edges of the pulse signal.

On the other hand, upon detection of the fall of the pulse signal, the fall detector 9 applies the fall detection signal to a second counter 14 connected to the output thereof.

The second counter 14 always counts the clock signals from the clock generator 12 as is the case with the first counter 11 and, when supplied with the fall detection signal, provides the current count value as a second count value DC to the decoder 13, while at the same time it resets its count value to zero and resumes counting the clock signals. The second count value DC from the second counter 14 represents the time interval between two successive trailing or falling edges of the pulse signal.

The decoder 13 is provided with a decoded table storage circuit 13a wherein combinations of transmission codes, each composed of the time intervals $i_1$ and $j_1$, between the first and third transitions $r_4$ and $r_3$ and between the second and fourth transitions $r_2$ and $r_4$, are stored in correspondence with the respective states of the two-bit data. The correspondence between the combinations of the transmission codes $i_1$ and $j_1$, and the two-bit data in the decoded table storage circuit 13a is the same as the correspondence between the transmission codes $i_1$ and $j_1$ and the two-bit data in the encoded table storage circuit 4a of the pulse modulating equipment (see FIG. 1).

The decoder 13 detects the combination of the transmission codes $i_1$ and $j_1$ from the first and second count values UC and DC and reads out the two-bit data corresponding to the detected combination of the transmission codes from the decoded table storage circuit 13a.

Figure 7:
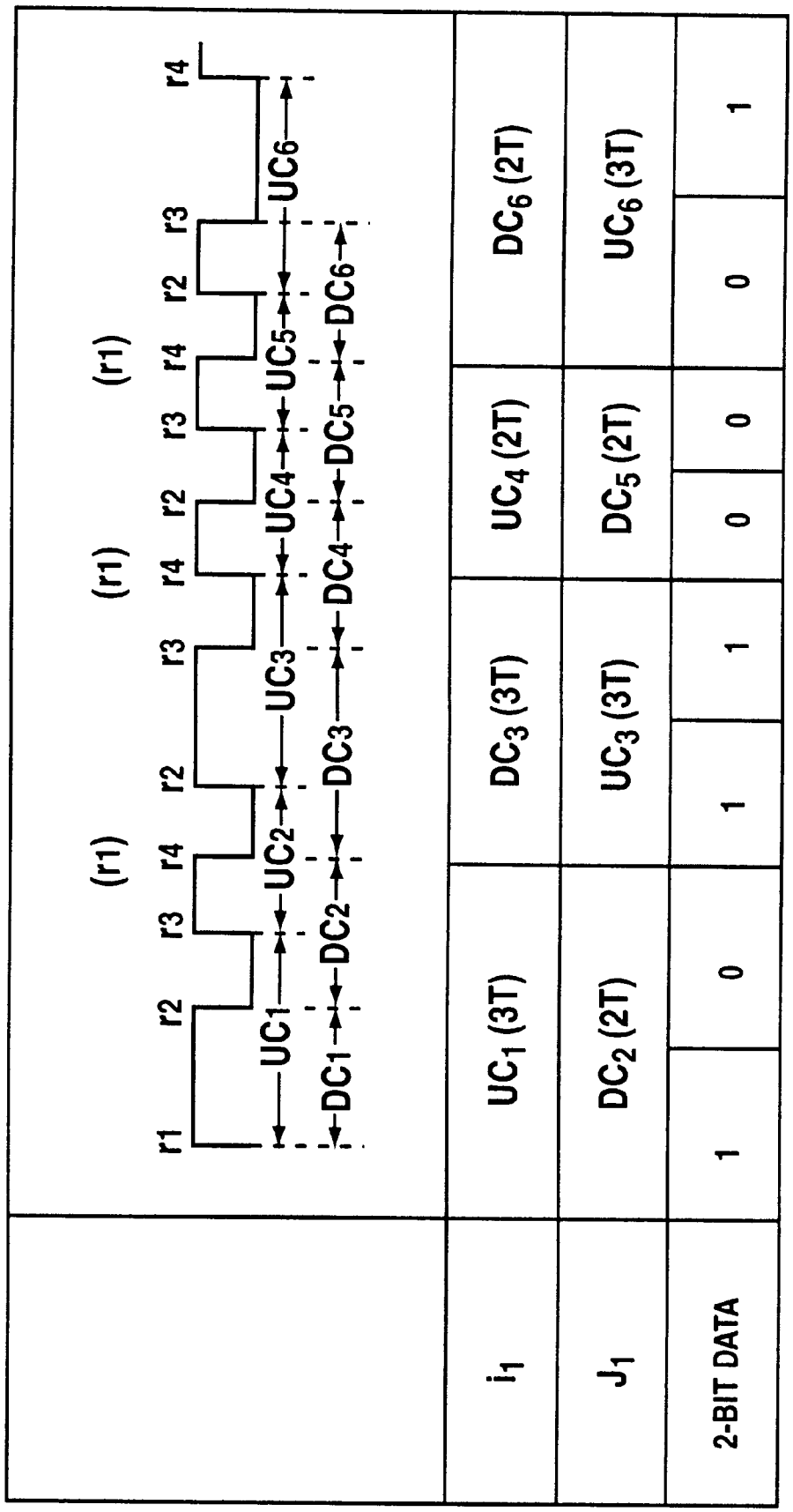
FIG. 7 is a diagram for explaining processing in a decoder circuit 13.

Turning to FIG. 7, the processing in the decoder 13 will be described below.

Provided that the pulse signal fed thereto from the receiver circuit 8 is a pulse signal of such a waveform as shown in FIG. 7, the decoder 13 detects the combination of the transmission codes $i_1$ and $j_1$ for each pulse unit signal converted from the two-bit data. In the case of pulse modulation by the two-bit variable length system, the pulse unit signal have four transitions and the first and fourth transitions are common to the pulse unit signals immediately preceding and succeeding the current one. Accordingly, the pulse signal can be split into pulse unit signals every third transitions.

As depicted in FIG. 7, upon each detection of the rise and fall of the pulse signal, the first and second count values UC and DC are alternately input into the decoder 13. Hence, whenever the first and second count values UC and DC are input into the decoder a total of three times, this point in time is regarded as the time when the pulse unit signals are concatenated and the first and second count values UC and DC input in this period between concatenated points are used to obtain transmission codes $i_1$ and $j_1$ of the pulse unit signal of this period.

As will be seen from FIG. 7, the count value input second in the above period represents the time interval between the first and third transitions of the pulse unit signal, that is, the transmission code $i_1$, and the count value input third in the above period represents the time interval between the second and fourth transitions of the pulse unit signal, that is, the transmission code $j_1$. In this way, the transmission codes $i_1$ and $j_1$ are derived from these count values.

In the case of a first pulse unit signal, the transmission codes $i_1$ and $j_1$ can be obtained from first and second count values UCI and DC2, respectively. Assuming that the period of the clock signal from the clock i generator 12 is 1/16 the unit time T of the pulse signal, the count value for the unit time T is 16, so that if the first count value UCI is within 48±3, the transmission code $i_1$ is 3T. Similarly, if the second count value DC2 is within 32+3, the transmission code $j_1$, is 2T.

Since the two-bit data corresponding to the combination (3T, 2T) of the transmission codes $i_1$ and $j_1$ is "1,0," (as shown in FIG. 1) the two-bit data is fed as two-bit parallel data to a parallel-serial converter 15.

Likewise, the transmission codes $i_1$ and $j_1$ of the second pulse unit signal are derived from the second and first count values DC3 and UC3, respectively. Since the second and first count values DC3 and UC3 are both within 48+3, the transmission codes $i_1$ and $j_1$ are (3T, 3T), then the corresponding two-bit data "1, 1" is read out, and two-bit parallel data "1, 1" is fed to the parallel-serial converter 15.

The parallel-serial converter 15 converts the parallel data, output in units of two bits from the decoder 13, into serial signals and provides them to a buffer 16, which concatenates the serial signals and outputs them as a demodulated signal composed of a plurality of bits.

As described above, the pulse demodulating equipment 7 detects the time intervals between the leading or rising edges of the pulse signal and between its trailing or falling edges and emulates pulse signal into data bits. Hence, even like pulse width changes under the influence of the transmission line or the frequency characteristics in the modem, the time intervals will not change and the demodulation can be achieved with accuracy.

FIG. 8 is a table explanatory of a pulse modulating method according to another embodiment of the present invention, showing, 16 kinds of states of four-bit data and the relationships between them and the transmission codes $i_1$, $j_1$ and pulse codes corresponding thereto.

In this embodiment, an input signal composed of plural data bits is divided into words of four-bit data, which are each converted into a pulse unit signal of three through five bits according to the state of the four-bit data. (The pulse modulating method according to this embodiment will hereinafter be called a four-bit variable length system.)

As shown in FIG. 8, the number of data states of the 4-bit data is 16, and 16 combinations of 2T, 2.5T, 3T and 3.5T corresponding to the respective data states are assigned to the transmission codes $i_1$ and $j_1$. When the unit time T is used as the minimum pulse width of the pulse unit signal and the minimum pulse quiescent time as mentioned above, the transmission codes $i_1$ and $j_1$ need not always be integral multiples of the unit time T.

For example, in case a 4-bit data divided into a word is "1,0,0,1", the corresponding transmission codes $i_1$ and $j_1$ are 2.5T and 3T. The pulse unit signal that is generated based on such transmission codes has the time interval 2.5T between its first and third transitions $r_1$ and $r_3$ and the time interval 2T between its second and fourth transitions $r_2$ and $r_4$, and the pulse code for generating the pulse unit signal is "11000111." No description will be given of the method for generating the pulse unit signals based on the transmission codes since it is the same as that described previously with reference to FIG. 2. Incidentally, since the pulse unit signal is not a rectangular wave composed of integral bits, 1-bit pulse unit signal is represented by a 2-bit pulse code for the sake of convenience.

Also in this instance, the pulse unit signals are concatenated using the fourth transition r4 of the immediately preceding one of them as the first transition of the immediately succeeding pulse unit signal as is the case with the afore-mentioned 2-bit modulating system. Accordingly, the first transition $r_1$ of the pulse unit signal of an even-numbered word is the fall of the pulse, so that the pulse waveform is opposite in level to that shown in FIG. 8 and the pulse code is also opposite.

Since the pulse unit signals are concatenated using the last inversion of the immediately preceding signal as the first inversion of the succeeding signal as mentioned above, the frame transmission period for transmitting the whole data bit stream can be reduced.

FIGS. 5(e) and 6(c) show waveforms of the pulse signals converted by the 4-bit variable length system.

As will be seen from FIGS. 5(e) and 6(c), the frame transmission period for transmitting the whole data bit stream is half that in the case of the 2-bit variable length system, substantially equal to that in the case of the NRZ modulating system and extremely shorter than in the cases of the PPM and SIR systems. By dividing the input signal into data of a larger number of bits in the pulse modulation, the entire transmission period can be further reduced.

The pulse modulating equipment 1 of FIG. 3 can be used in the 4-bit variable length system, by using an arrangement in which the serial-parallel converter 3 divides the input signal into words of 4-bit data and outputs 4-bit parallel data and the relationships between the data bits and the pulse codes shown in FIG. 8 are stored in the encoded table storage circuit 4a.

Further, the pulse demodulating equipment 7 of FIG. 4 can be used, by storing in its decoded table storage circuit 13a, the relationships between the data bits and the pulse codes shown in FIG. 8.

FIG. 9 is a table explanatory of a pulse modulating method according to further another embodiment of the present invention, showing 16 kinds of states of 4-bit data and the relationships thereto of transmission codes $i_1$, $i_2$, $j_1$, $j_2$ and pulse codes.

In this third embodiment, the input signal composed of plural data bits is divided into words of 4-bit data, each of which is converted into a 6-bit pulse unit signal of fixed length based on the state of the divided 4-bit data. (The pulse modulating method according to this embodiment will hereinafter be referred to as a 4-bit fixed length system.)

The transmission code $i_2$ represents the time interval between third and fifth transition of the pulse unit signal and the transmission code $j_2$ represents the time interval between its fourth and sixth transitions. As shown, the 16 kinds of pulse unit signals are all 6 bits long, and as compared with the above-described variable length system, the number of transitions is six in the case of representing the 4-bit data including the transmission codes $i_2$ and $j_2$.

To obtain 16 variant kinds of transmission codes, in accordance with which pulse unit signals of fixed 6-bit length, NRZ data signals are assumed which were NRZ data-modulated by 6-bit data. The transmission codes are gained from the time intervals between leading edges and between trailing edges of the NRZ data signals.

That is, 16 kinds of NRZ data signals are assumed which were NRZ data-modulated by 16 variant kinds of 6-bit data whose most and least significant bits MSB and LSB are "1s" and whose intermediate bits are variant 4-bit data. Since the NRZ data signals have their most and least significant bits formed by NRZ data modulated versions of data bits "1," the pulse unit signal have rising and trailing edges at their first and sixth bits but each has one of 16 variant kinds of different intermediate waveforms.

Hence, by deriving the transmission codes $i_1$, $i_2$, $j_1$, $j_2$, from the time intervals between odd-numbered transitions and between even-numbered transitions, 16 kinds of combinations are obtained and the pulse units signals based on the transmission codes have a fixed 6-bit length.

Also in this 4-bit fixed length system, the pulse unit signal converted from an even-numbered word has its waveform inverted and is concatenated with the intermediately preceding and succeeding pulse unit signals, using the transitions at the concatenations in common to them.

FIGS. 5(f) and 6 show waveforms of pulse signals converted by the 4-bit fixed length system.

As is evident from FIG. 6, the 4-bit fixed length system permits high-speed transmission as compared with the PPM and SIR systems, and since the pulse unit signals are fixed at 6 bits, demodulation is easier than in the cases of the 2-bit and 4-bit variable length systems of the present invention. Further, even if an error arises in one word during its demodulation, it does not affect the pulse unit signals of other words, and hence it does not constitute an error over the entire demodulation.

Figure 10:
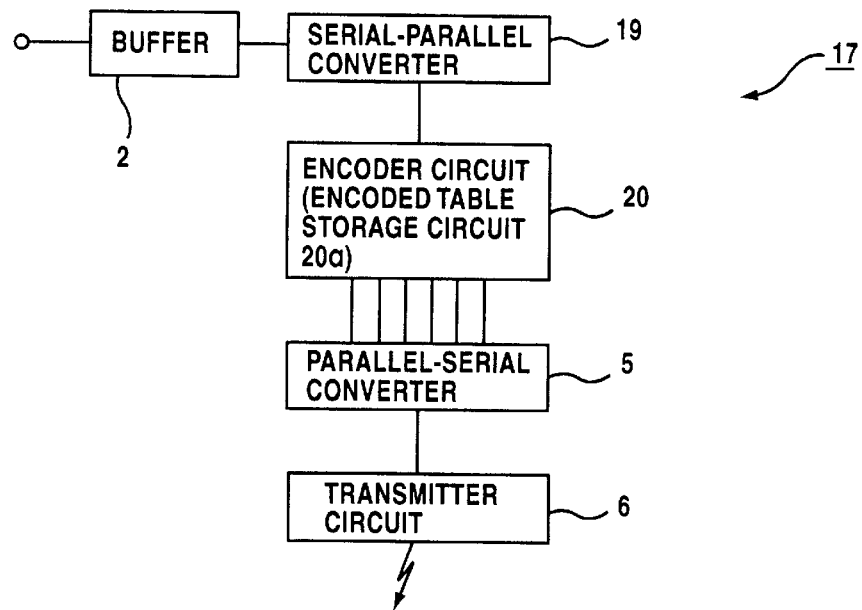
FIG. 10 is a block diagram illustrating the configuration pulse modulating equipment 17 for use in the 4-bit fixed length system according to the present invention.
Figure 11:
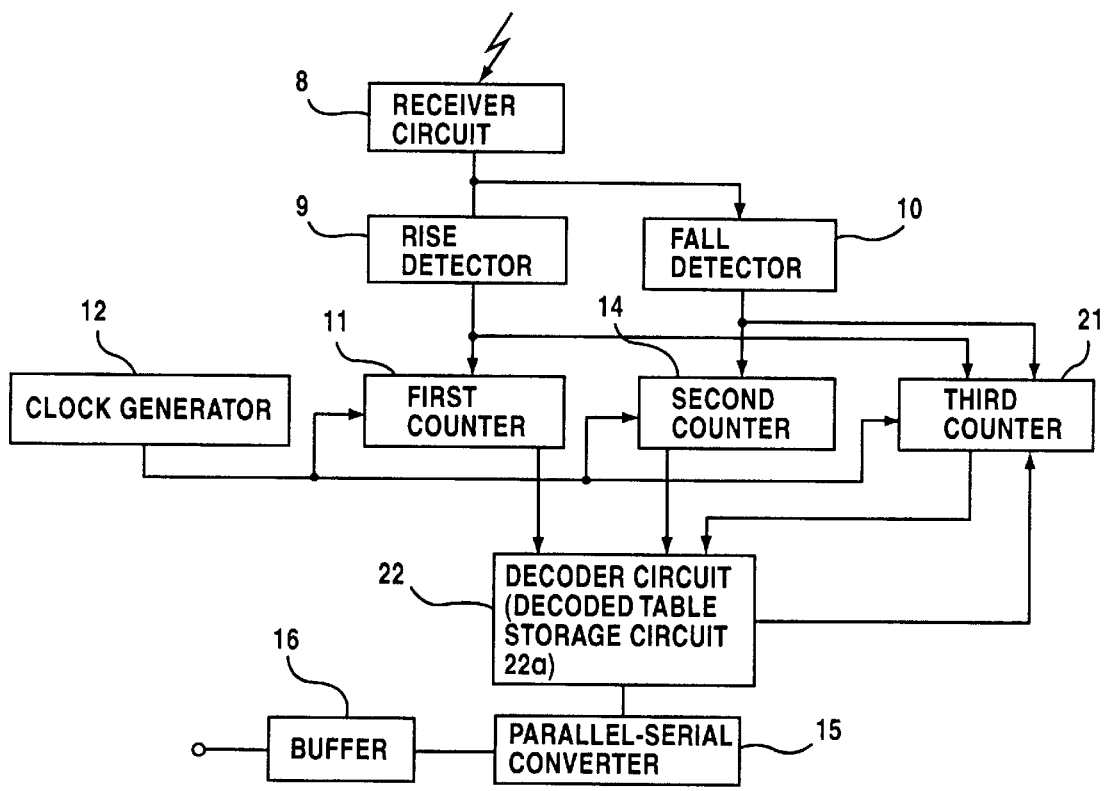
FIG. 11 is a block diagram illustrating the configuration of pulse demodulating equipment 18 for use in the 4-bit fixed length system according, to the present invention.

FIGS. 10 and 11 illustrate in block form pulse modulating equipment 17 and pulse demodulating equipment 18 that are used in the 4-bit fixed length system.

The pulse modulating equipment and the pulse demodulating equipment are substantially identical in construction with the pulse modulating equipment 1 and the pulse demodulating equipment 7 described previously in respect of FIGS. 3 and 4. The same parts are identified by the same reference numerals and their description will not be repeated here.

A serial-parallel converter 19 of the pulse modulating equipment 17 divides the serial input signal from the buffer 4 into words of 4-bit data and outputs 4-bit parallel data to an encoder circuit 20.

The encoder circuit 20 reads out the pulse codes corresponding to the 4-bit parallel data from an encoded table storage circuit 20a having stored therein 4-bit data and pulse codes in correspondence with each other as shown in FIG. 9, the pulse code thus read out being fed to the parallel-serial converter 5.

This pulse code is to form the pulse unit signal of the waveform shown in FIG. 9 based on the transmission codes $i_1 i, i_2, j_1, j_2$ corresponding to the state of the 4-bit data, and since the pulse unit signals have the 6-bit fixed length, the pulse codes that are output are all 6 bits long. Consequently, the timing generator 30 in the pulse modulating equipment 1 of the variable length system is unnecessary.

The pulse demodulating equipment 18 is provided with a third counter 21 which is supplied with the rise detection signal and the fall detection signal from the rise detector 9 and the fall detector 10, respectively. In order that the decoder circuit 22 divides the input pulse signal at regular time intervals F (the time intervals corresponding 6-bit data in the case of the 4-bit fixed length system) for the demodulation of each pulse unit signal, the third counter 21 begins to count clock signals at the start of the pulse unit signal and, upon each reception of the rise or fall detection signal, outputs the count value at that time as a third count value BC to a decoder circuit 22, thereby notifying the termination of the pulse unit signal.

In other words, the decoder circuit 22 applies a reset signal to the third counter 21 at the start of the pulse unit signal (that is also the termination of the immediately preceding pulse unit signal) to cause the third counter to start counting the clock signals and, upon each input thereto of the third count value BC for each transition of the pulse signal, compared the third count value BC with the fixed time interval F (corresponding to 6 bits) and, when the third count value BC indicates nearly equal to the time interval of 6 bits, regards the transition at that time as the end of the pulse unit signal. Since the position of termination of the pulse unit signal is also used as the position of start of the immediately succeeding pulse unit signal, the decoder circuit applied the reset signal again to the third counter 21 to cause it to begin counting the clock signals.

The decoder circuit 22 is provided with a decoded table storage circuit 22a wherein there are stored the transmission codes $i_1, i_2, j_1, j_2$ and respective states of the 4-bit data in correspondence with each other as shown in FIG. 9. The transmission codes are detected from the pulse unit signal divided into each word by the above-described method and the 4-bit data corresponding to the transmission codes is read out from the decoded table storage circuit 22a. Then, the 4-bit data is fed as parallel data to the parallel-serial converter 15.

Figure 12:
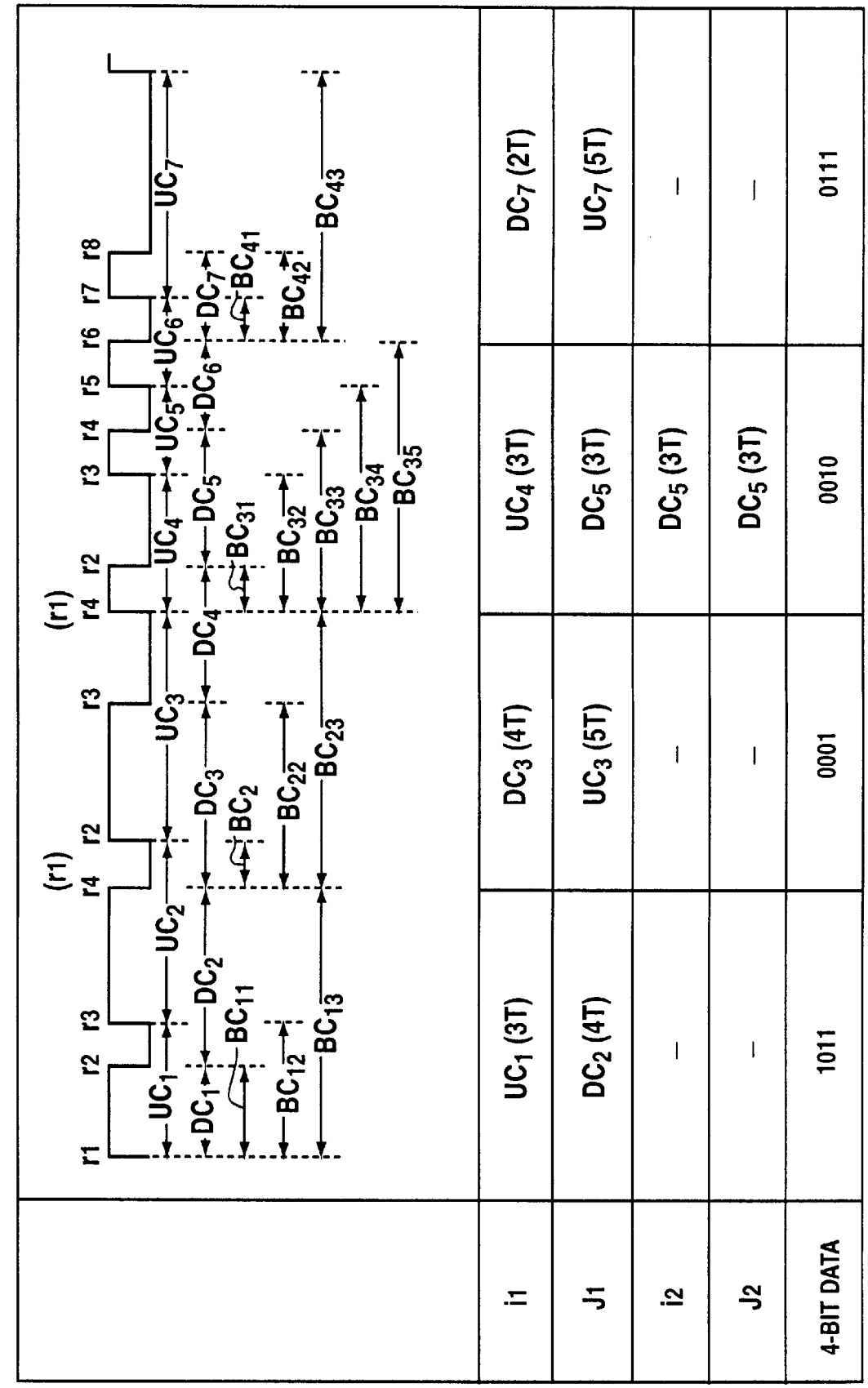
FIG. 12 is a diagram for explaining processing in a decoder circuit 22.
Figure 13:
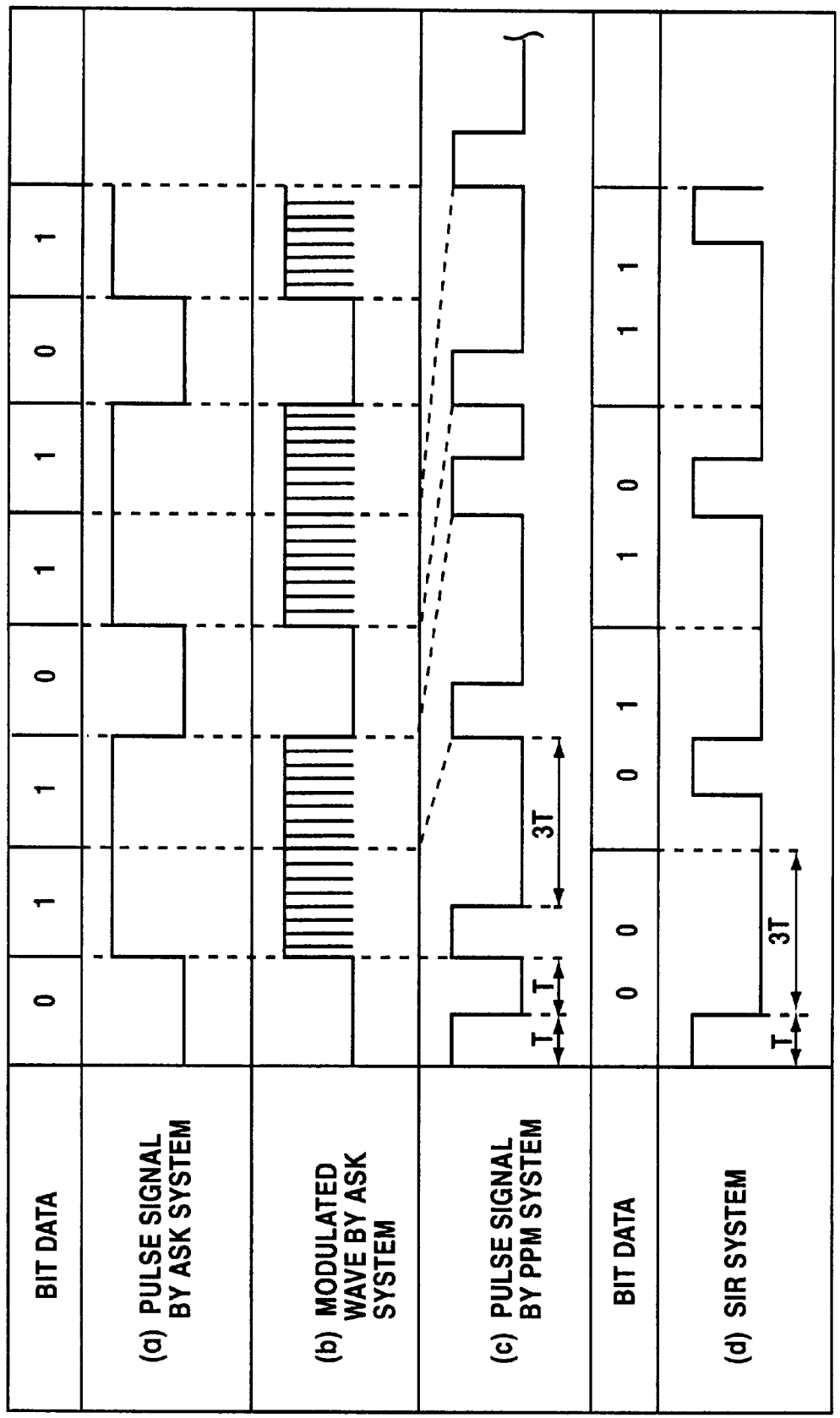
FIG. 13 is a waveform diagram showing a conventional pulse modulating method.
Figure 14:
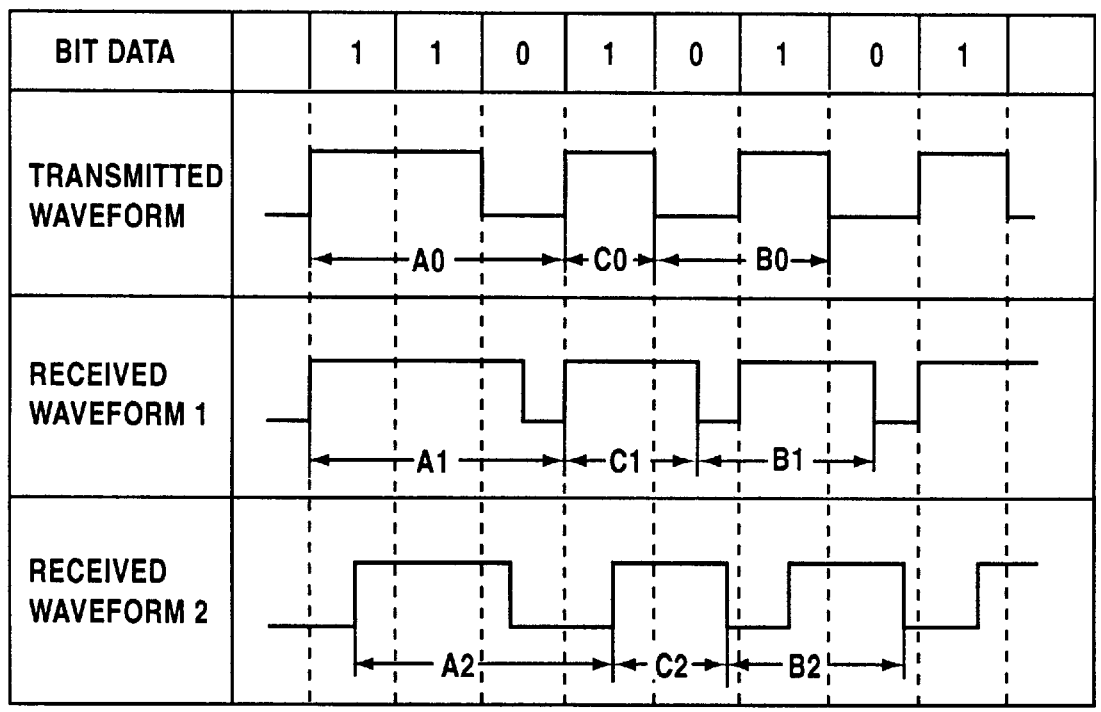
FIG. 14 is a waveform diagram showing the relationships between transmitted and received waveforms.

Turning to FIG. 12, the above processing in the decoder circuit 22 will be described below.

Assuming that the pulse signal from the receiver circuit 8 has such a waveform as shown in FIG. 12, the decoder circuit 22 makes a comparison between the third count value BC which is output from the third counter 21 upon each transition of the pulse signal and the 6-bit duration. Provided that the period of the clock signal from the clock generator 12 is 1/16 the unit time or duration T of the pulse signal, the pulse unit signal whose 1-bit duration is equal to the unit time T indicates that the count value is 6*16=96 and has reached the end of the pulse unit signal. On the other hand, the third count value BC represents the time interval between the start of the pulse unit signal and its transition at the time when the third count value BC is output, and at the end of the pulse unit signal, the pulse unit signal transits its level, so that when the third count value BC is within 96±3, the transition at that time can be regarded as the end of the pulse unit signal.

For example, during the input of the first pulse unit signal, one of third count values BC11, BC12 and BC13 are input upon each transition of the pulse signal; since the third count value BC13 is within 96±3, the transition $r_4$ is regarded as the end of the first pulse unit signal. Similarly, during the input of the third pulse unit signal, third count values BC31, . . . , BC34, BC35 are input; since the third count value BC35 is within 96±3, the transition $r_6$ is regarded as the end of the third pulse unit signal.

As is evident from FIG. 12, the count value input second from the first counter 11 or second counter 14 during the period of each pulse unit signal represents the time interval between first and third transitions, that is, the transmission code $i_1$; similarly, the count value input third represents the transmission code $j_1$, the count value input fourth the transmission code $i_2$ and the count value input fifth the transmission code $j_2$.

Thus, the transmission codes $i_1, i_2, j_1, j_2$ contained in each pulse unit signal are detected from these count values UC and DC.

For example, in the second pulse unit signal, the transmission code $i_1$ is represented by the second count value DC3 and the transmission code $j_1$ by the first count value UC3, and since the second and first count values DC3 and UC3 are within 64±3 and within 80±3, respectively, the transmission codes $i_1$ and $j_1$ of the second pulse unit signal are (4T, 5T). Likewise, the transmission codes $i_1, j_1, i_2, j_2$ of the third pulse unit signal are (3T, 3T, 2T, 2T) since the transmission code $i_1$ is represented by the first count value UC4, the transmission code $j_1$ by the second count value DC5, the transmission code $i_2$ by the first count value UC5 and the transmission code $j_2$ by the second count value DC6.

The 4-bit data whose transmission codes $i_l$ and $j_1$ correspond to the combination (4t, 5T) is "0, 0, 0, 1" as shown in FIG. 9 and this 4-bit data is read out of the decoded table storage circuit 22a and fed as 4-bit parallel data to the parallel-serial converter 15. The 4-bit data whose transmission codes $i_1, j_1, i_2, j_2$ correspond to the combination (3T, 3T, 2T, 2T) is "0,0,1,0" as shown in FIG. 9 and this 4-bit data is read out of the decoded table storage circuit 22a and it is similarly fed as 4-bit parallel data to the parallel-serial converter 15.

While in the embodiments of the present invention described above the last transition of each pulse unit signal is used as the first transition of the immediately succeeding pulse unit signal to concatenate the pulse unit signal, their transitions need not allows be used in common. In such a case, an odd-numbered transition can always be defined as the rise of the pulse signal and an even-numbered transition as the fall of the pulse signal, so that the transmission codes i and j can be represented by combinations of the time intervals between leading edges and between railing edges of the pulse unit signal.

Furthermore, although in the embodiments of the invention the unit time T is used as the minimum pulse width of the pulse unit signal and as the minimum pulse quiescent time, the invention is not limited specifically thereto. By changing the unit time T, the frame transmission time for the converted pulse signal can be changed as desired.

The correspondence between respective states of data bits of each word and the transmission codes are not limited specifically to those shown in the drawings but other correspondence can be used as long as they have a one-to-one correspondence. In the third embodiment, in particular, the intermediate 4-bit data of the 6-bit data assumed to obtain combinations of transmission codes are made to correspond to the 4-bit data divided for each word so that they match each other, but both of the bit data need not always to match each other.

As described above, the pulse modulating method, pulse modulating equipment and pulse demodulating equipment according to the sent invention are suitable for use in optical communication systems that employ infrared rays or similar rays of light as carriers.

I claim:

1. A pulse modulating method which coverts an input signal composed of plural data bits into a modulated pulse signal, comprising the steps of:
    dividing the input signal into words each composed of n-bit data (n being a positive integer equal to or greater than 2);
    combining time intervals $i_m$ and $j_m$ being a positive integer starting with 1) to form at least $2^n$ or more different transmission codes;
    making all states of the n-bit data correspond to the transmission codes, respectively;
    converting, in accordance with the transmission code corresponding to the state of the data bits for each word, the input signal into variable length pulse unit signals which have the time interval $i_m$ between (2m−1)th and (2m+1)th transitions and the time interval $j_m$ between (2m)th and (2m+2)th transitions so that the time intervals F between the first and last transitions of the pulse unit signals are constant; and
    concatenating the pulse unit signals thus converted in word units into a modulated pulse signal,
    wherein $2^n$ kinds of NRZ (Non-Return-to-Zero) data signals are assumed which were NRZ data modulated by (n+2) pieces of data bits whose most and least significant bits are "1s" in common to them but whose intermediate data bits differ from one another,
    wherein time intervals between (2m−1)th and (2m+1)th transitions and between its (2m)th and (2m+2)th transitions of each NRZ data signal are combinations of the time intervals $i_m$ and $j_m$, and
    wherein the time interval F is used as the duration of NRZ data signals which were NRZ data modulated by (n+2) pieces of data bits.

2. A Pulse modulating equipment comprising:
    a serial-parallel converter which divides a serial input signal composed of a plurality of data bits in steps of n bits (n being a positive integer equal to or greater than 2) and outputs the input signal as n-bit parallel data;
    an encoded table storage circuit which obtains at least $2^n$ kinds of different transmission codes by combining time intervals $i_m$ and $j_m$ (m being a positive integer beginning with 1) and wherein pulse codes which have time intervals between (2m−1)th and (2m+1)th transitions and between (2m)th and (2m+2)th transitions of pulse unit signals defined by $i_m$ and $j_m$, respectively, in accordance with the transmission codes are stored in correspondence with respective states of n-bit parallel data;
    an encoder circuit which reads out the pulse code corresponding to the n-bit parallel data from the encoded table storage circuit and outputs it;
    a pulse signal generator which generates pulse unit signals from the pulse codes and outputs them serially; and
    a pulse output circuit which concatenates the pulse unit signals converted every n-bit parallel data into a pulse signal and outputs it.

3. A Pulse demodulating equipment comprising:
    a transition detecting circuit which divides an input pulse signal every fixed number K of transitions and, for each pulse unit signal defined by the K transitions, repeatedly detects time intervals $i_m$ and $j_m$ between (2m−1)th (m being a positive integer beginning with 1) and (2m+1)th transitions and between (2m)th and (2m+2)th transitions;
    a decoded table storage circuit wherein at least $2^n$ (n being a positive integer equal to or greater than 2) different combinations of time intervals $i_m$ and $j_m$ (m being a positive integer in the range of 1 to k) are stored in correspondence with respective states of the n-bit data;
    a decoder circuit which reads out the n-bit data from the decoded table storage circuit corresponding to the combination of the time intervals $i_m$ and $j_m$ detected by the transition detecting circuit and outputs it as n-bit parallel data; and
    a parallel-serial converter which converts each n-bit parallel data demodulated for each pulse unit signal into a serial signal and outputs it as a signal composed of a plurality of data bits.

4. A Pulse demodulating equipment comprising:
    a transition detecting circuit which divides an input pulse signal at fixed time intervals F and, for each pulse unit signal defined by the duration F, detects time intervals $i_m$ and $j_m$ between (2m−1)th (m being a positive integer beginning with 1) and (2m+1)th transitions and between (2m)th and (2m+2)th transitions;
    a decoded table storage circuit wherein at least $2^n$ (n being a positive integer equal to or greater than 2) different combinations of time intervals $i_m$ and $j_m$ are stored in correspondence with respective states of the n-bit data;
    a decoder circuit which reads out the n-bit data from the decoded table storage circuit corresponding to the combination of the time intervals $i_m$ and $j_m$ detected by the transition detecting circuit and outputs it as n-bit parallel data; and
    a parallel-serial converter which converts each n-bit parallel data demodulated for each pulse unit signal into a serial signal and outputs it as a signal composed of a plurality of data bits.

* * * * *